US012016163B2

(12) United States Patent
Liu et al.

(10) Patent No.: US 12,016,163 B2
(45) Date of Patent: Jun. 18, 2024

(54) BOX TYPE COOLING STRUCTURE FOR CONTROLLER

(71) Applicant: HEFEI JEE POWER SYSTEMS CO., LTD., Hefei (CN)

(72) Inventors: Lei Liu, Hefei (CN); Yong Cheng, Hefei (CN); Feng Liu, Hefei (CN)

(73) Assignee: HEFEI JEE POWER SYSTEMS CO., LTD., Hefei (CN)

( * ) Notice: Subject to any disclaimer, the term of this patent is extended or adjusted under 35 U.S.C. 154(b) by 203 days.

(21) Appl. No.: 17/709,107

(22) Filed: Mar. 30, 2022

(65) Prior Publication Data

US 2022/0225540 A1 Jul. 14, 2022

Related U.S. Application Data

(63) Continuation of application No. PCT/CN2021/132296, filed on Nov. 23, 2021.

(30) Foreign Application Priority Data

Nov. 24, 2020 (CN) .......................... 202011330020.7

(51) Int. Cl.
*H05K 7/20* (2006.01)
(52) U.S. Cl.
CPC ..... *H05K 7/20927* (2013.01); *H05K 7/20254* (2013.01); *H05K 7/20272* (2013.01)
(58) Field of Classification Search
CPC .......... H05K 7/20254; H05K 7/20927; H05K 7/20272; H01L 23/473
See application file for complete search history.

(56) References Cited

U.S. PATENT DOCUMENTS

| 8,805,602 | B2 * | 8/2014 | Yun ..................... | H05K 7/20872 |
| | | | | 363/141 |
| 10,403,561 | B2 * | 9/2019 | Yoshihara .......... | H05K 7/20927 |
| 11,558,983 | B2 * | 1/2023 | Smal .................. | H05K 7/20927 |
| 2013/0206370 | A1 * | 8/2013 | Smalen ............... | H05K 7/20927 |
| | | | | 165/104.26 |
| 2019/0319551 | A1 | 10/2019 | Song et al. | |

(Continued)

FOREIGN PATENT DOCUMENTS

| CN | 103137573 A | 6/2013 |
| CN | 205986700 U | 2/2017 |
| CN | 107241890 A | 10/2017 |

(Continued)

OTHER PUBLICATIONS

First Office Action issued in counterpart Chinese Patent Application No. 202011330020.7, dated Apr. 28, 2022.

(Continued)

*Primary Examiner* — Zachary Pape
(74) *Attorney, Agent, or Firm* — Westbridge IP LLC

(57) ABSTRACT

Disclosed is a box type cooling structure of a controller, which includes an upper water channel substrate, a front water channel substrate, a left water channel substrate, a rear water channel substrate, a right water channel substrate, a lower water channel substrate and an intermediate water channel substrate sequentially surrounding the controller in six directions to form a box structure. Each water channel substrate is internally provided with a water channel structure.

9 Claims, 10 Drawing Sheets

(56) References Cited

U.S. PATENT DOCUMENTS

2019/0320549 A1    10/2019  Song et al.

FOREIGN PATENT DOCUMENTS

| | | |
|---|---|---|
| CN | 107340729 A | 11/2017 |
| CN | 107787160 A | 3/2018 |
| CN | 207665389 U | 7/2018 |
| CN | 108973892 A | 12/2018 |
| CN | 208572627 U | 3/2019 |
| CN | 109890169 A | 6/2019 |
| CN | 209545381 U | 10/2019 |
| CN | 210052102 U | 2/2020 |
| CN | 210806443 U | 6/2020 |
| CN | 211792642 U | 10/2020 |
| CN | 112654210 A | 4/2021 |
| WO | 2019205692 A1 | 10/2019 |

OTHER PUBLICATIONS

International Search Report and Written Opinion issued in corresponding PCT Application No. PCT/CN2021/132296, dated Jan. 28, 2022.

\* cited by examiner

BOX TYPE COOLING STRUCTURE FOR CONTROLLER

CROSS-REFERENCE TO RELATED APPLICATIONS

This application is a continuation of International Application No. PCT/CN2021/132296, filed on Nov. 23, 2021, which claims priority to Chinese Patent Application No. 202011330020.7, filed on Nov. 24, 2020. The disclosures of the above-mentioned applications are incorporated herein by reference in their entireties.

TECHNICAL FIELD

The present application relates to the field of cooling controllers, in particular to a box type cooling structure for a controller.

BACKGROUND

At present, the water cooling mode is the main cooling mode of the controllers, and for high heating components such as modules, capacitors and inductors, the mode of only cooling one side is adopted and the cooling effect is poor.

In the related art, the high-voltage portion is installed with the low-voltage portion in the controller, and the internal cavity of the controller has not been separated, and the high-pressure portion interferes with the low-voltage portion, and the EMC (Electro Magnetic Compatibility) performance of the whole machine is poor.

In the related art, when a vehicle adopts multiple controllers, a split structure is adopted, the occupied space is relatively large, and it is also not good for disassembly and repairing.

SUMMARY

The present application aims to provide a box type cooling structure for a controller. High-voltage portion and low-voltage portion are separated by adopting a box type design, mutual interference is reduced, performance of the vehicle is improved, cooling water channels are arranged around the high heating components, and the cooling effect is improved.

The technical solutions of the present application are as follows.

A box type cooling structure of a controller, the controller includes a driving and controlling board, an IGBT module and a film capacitor, the box type cooling structure includes an upper water channel substrate, a front water channel substrate, a left water channel substrate, a rear water channel substrate, a right water channel substrate and a lower water channel substrate sequentially enclosed in six directions of the controller, water channel structures are arranged in the upper water channel substrate, the front water channel substrate, the left water channel substrate, the rear water channel substrate, the right water channel substrate and the lower water channel substrate.

In an embodiment, a water inlet is provided at a top of the upper water channel substrate, a first water outlet, a second water outlet, a third water outlet and a fourth water outlet are arranged in four corners of a bottom of the upper water channel substrate;
  a second water inlet communicating with the first water outlet is provided at a top of the front water channel substrate, and a fifth water outlet is provided at a bottom of the front water channel substrate;
a third water inlet communicating with the second water outlet is provided at a top of the left water channel substrate, and a sixth water outlet is provided at a bottom of the left water channel substrate;
a fourth water inlet communicating with the third water outlet is provided at a top of the rear water channel substrate, and a seventh water outlet is provided at a bottom of the rear water channel substrate;
a fifth water inlet communicating with the fourth water outlet is provided at a top of the right water channel substrate, and an eighth water outlet is provided at a bottom of the right water channel substrate;
a sixth water inlet communicating with the fifth water outlet, a seventh water inlet communicating with the sixth water outlet, an eighth water inlet communicating with the seventh water outlet and a ninth water inlet communicating with the eighth water outlet are provided at a top of the lower water channel substrate, and a ninth water outlet is provided at a bottom of the lower water channel substrate.

In an embodiment, the box type cooling structure further includes an intermediate water channel substrate; wherein a front supporting slide block is provided at a middle part of an inner side of the front water channel substrate and a rear supporting slide block is provided at a middle part of an inner side of the rear water channel substrate, a front end of the intermediate water channel substrate is fixed on the front supporting slide block, and a rear end of the intermediate water channel substrate is fixed on the rear supporting slide block;
  a tenth water outlet and a tenth water inlet are provided in a middle part of an inner side of the left water channel substrate or the right water channel substrate; an eleventh water inlet communicating with the tenth water outlet and an eleventh water outlet communicating with the tenth water inlet are provided at a left end or a right end of the intermediate water channel substrate.

In an embodiment, a first cavity is formed between the intermediate water channel substrate and the upper water channel substrate, and the driving and controlling board and the IGBT module are arranged inside the first cavity; and a second cavity is formed between the intermediate water channel substrate and the lower water channel substrate, and the film capacitor is arranged inside the second cavity.

In an embodiment, one side of the intermediate water channel substrate is provided with a notch, two connection terminals of the film capacitor are connected to the IGBT module via a first copper bar and a second copper bar passing through the notch respectively, In an embodiment, the rear water channel substrate is further provided with a three-phase output port, and a three-phase output copper bar of the IGBT module is extended out from the three-phase output port.

In an embodiment, a first cavity is formed between the intermediate water channel substrate and the upper water channel substrate, and the driving and controlling board and the film capacitor are arranged inside the first cavity;
  a second cavity is formed between the intermediate water channel substrate and the lower water channel substrate, and the IGBT module is arranged inside the second cavity.

In an embodiment, the film capacitor is arranged on one of the upper water channel substrate, the front water channel substrate, the left water channel substrate, the rear water channel substrate, the right water channel substrate and the lower water channel substrate, and a plurality of IGBT modules are arranged on the other of the upper water channel substrate, the front water channel substrate, the left water channel substrate, the rear water channel substrate, the right water channel substrate and the lower water channel substrate.

In an embodiment, the six water channel substrates are connected by fasteners, and joints of the water channel substrate are sealed by sealant or seal rings; and insertion positions of each water inlet and each water outlet are sealed by seal rings.

The present application has the advantages as follows.
1. The cooling structure adopts seven water channel substrates to be assembled in an assembled mode, which is good for disassembling and repairing.
2. Internal water channels are arranged in the seven water channel substrates, so that to cool the four sides of each of the IGBT modules, the capacitors, the copper bars and the inductors in the controller, and the cooling effect is better.
3. Cavities are formed in the controller, high-voltage components can be separated from the low-voltage components in the controller, and mutual interference is reduced.
4. The intermediate water channel substrate is amounted in a plug-in mode, which is good for the installation and disassembling of the intermediate water channel substrate.
5. The water channels in the seven water channel substrates can be communicated with each other, so that circulating cooling of the components in the controller is realized.
6. The high heating components such as the IGBT modules, the capacitors or the inductors in the controller can be freely arranged on each water channel substrate, and the structural arrangement is relatively simple.

BRIEF DESCRIPTION OF THE DRAWINGS

The present application is further described below with reference to the accompanying drawings and the embodiments.

DETAILED DESCRIPTION OF THE EMBODIMENTS

First Embodiment

Figure 1:
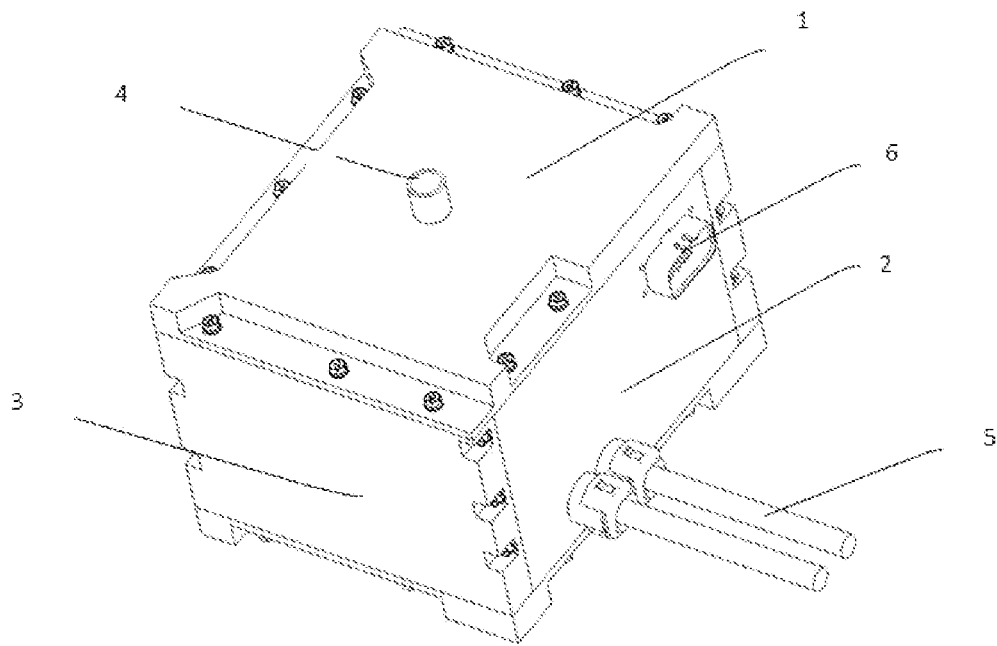
FIG. 1 is an isometric view of a box type cooling structure of a controller of the present application.
Figure 2:
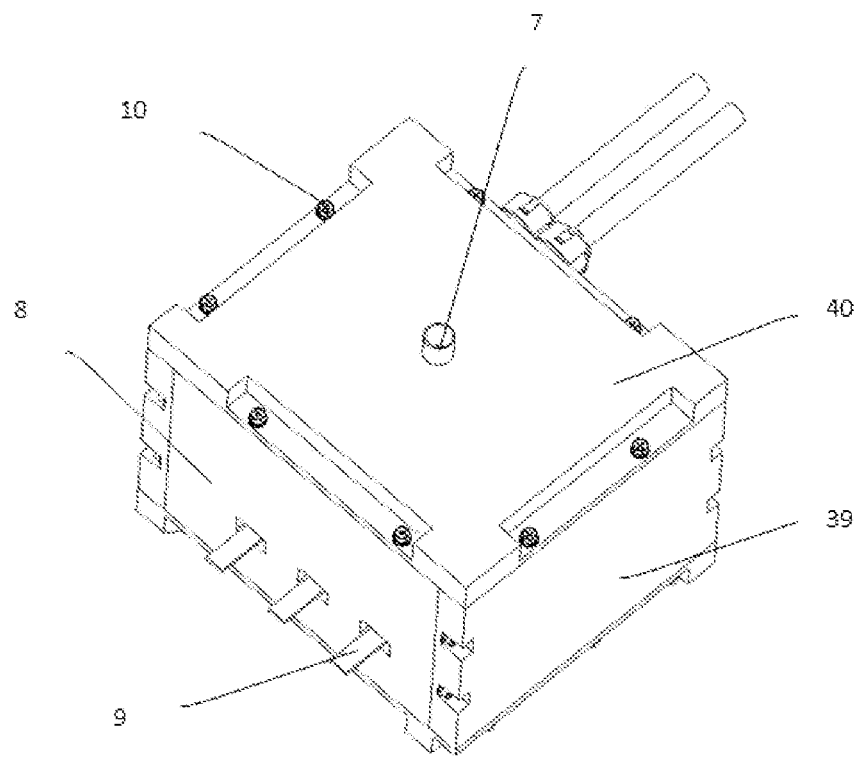
FIG. 2 is another isometric view of the box type cooling structure of the controller of the present application, viewed from another angle.

As shown in FIGS. 1 and 2, a box type cooling structure of a controller of the present application includes an upper water channel substrate 1, a front water channel substrate 2, a left water channel substrate 3, a rear water channel substrate 8, a right water channel substrate 39 and a lower water channel substrate 40 which sequentially surround in six directions of the controller to form a box structure. Water channel structures are provided in the six water channel substrates. The controller includes a driving and controlling board 11, an Insulated Gate Bipolar Translator (IGBT) module 12, and a film capacitor 19. The front water channel substrate 2 is provided with outlet ports for a positive busbar, a negative busbar 5, and a low-voltage plug 6 of the controller. A three-phase output port 81 is provided on the rear water channel substrate 8, and a three-phase output copper bar 9 of the IGBT module 12 is extended out from the three-phase output port 81.

Figure 3:
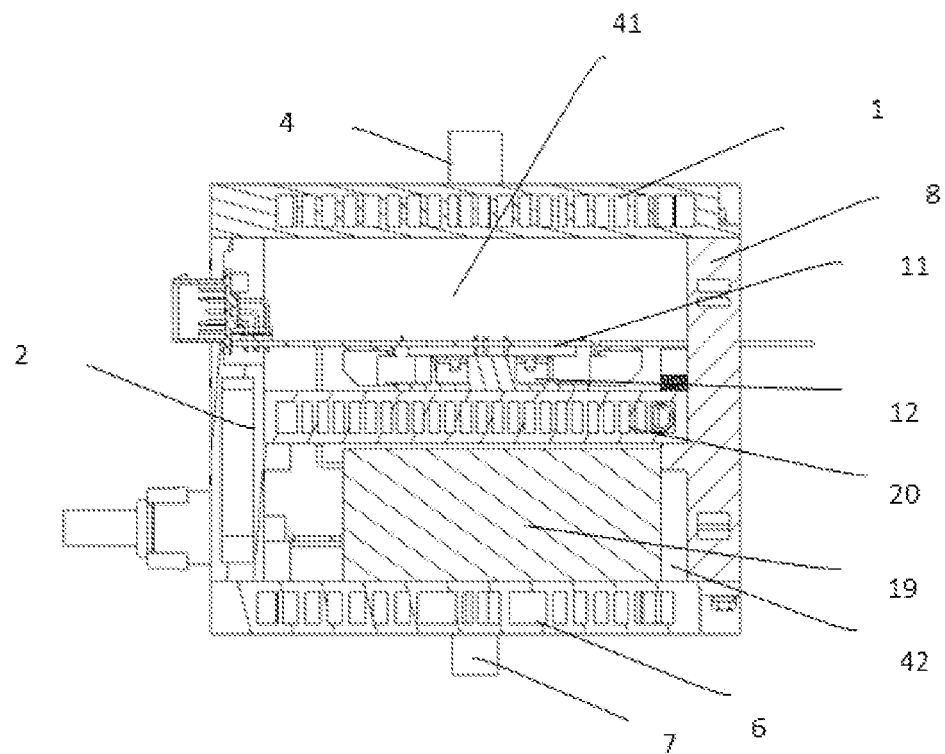
FIG. 3 is a cross-sectional view of an interior of the cooling structure of the controller of a first embodiment.
Figure 4:
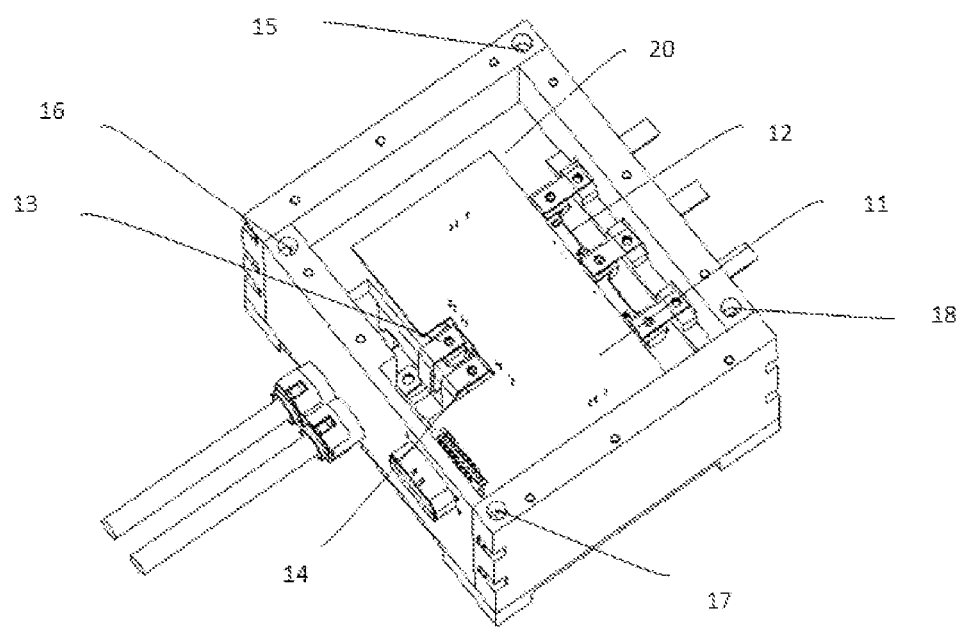
FIG. 4 is a schematic view of a first cavity inside the cooling structure of the controller of the first embodiment.
Figure 5:
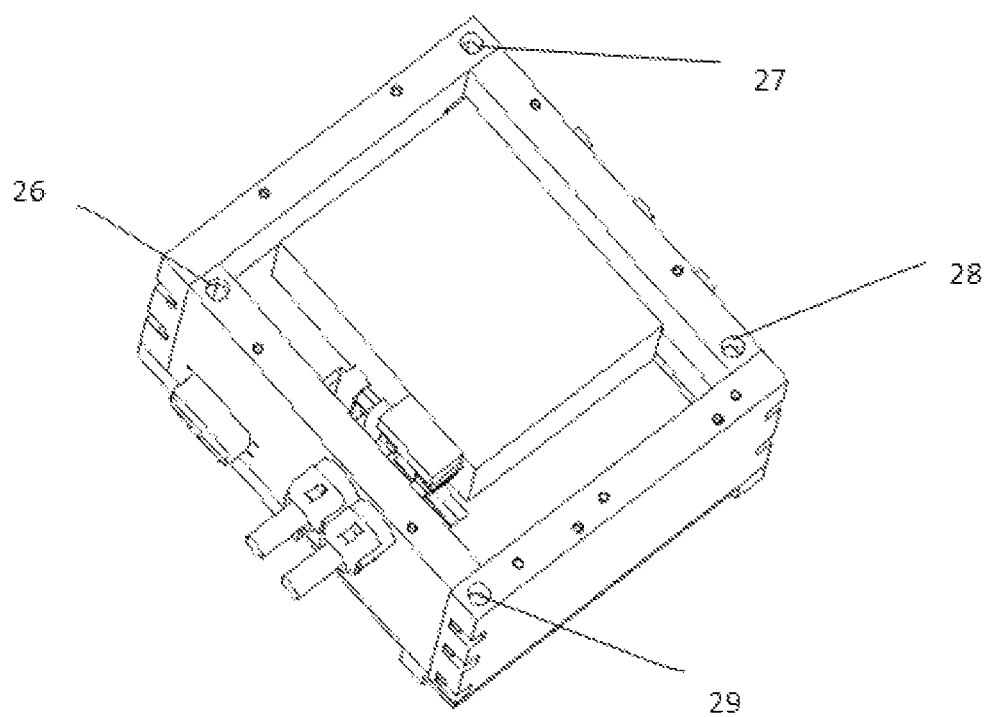
FIG. 5 is a schematic view of a second cavity inside the cooling structure of the controller of the first embodiment.

As shown in FIGS. 3-5, the box structure further includes an intermediate water channel substrate 20. A first cavity 41 is formed between the intermediate water channel substrate 20 and the upper water channel substrate 1. The driving and controlling board 11 and the IGBT module 12 are arranged inside the first cavity 41. A second cavity 42 is formed between the intermediate water channel substrate 20 and the lower water channel substrate 40, the film capacitor 19 is arranged inside the second cavity 42, a notch is formed in one side of the intermediate water channel substrate 20, and two connection terminals of the film capacitor 19 are connected to the IGBT module 12 by the first copper bar 13 and the second copper bar 14 correspondingly through the notch.

Figure 6:
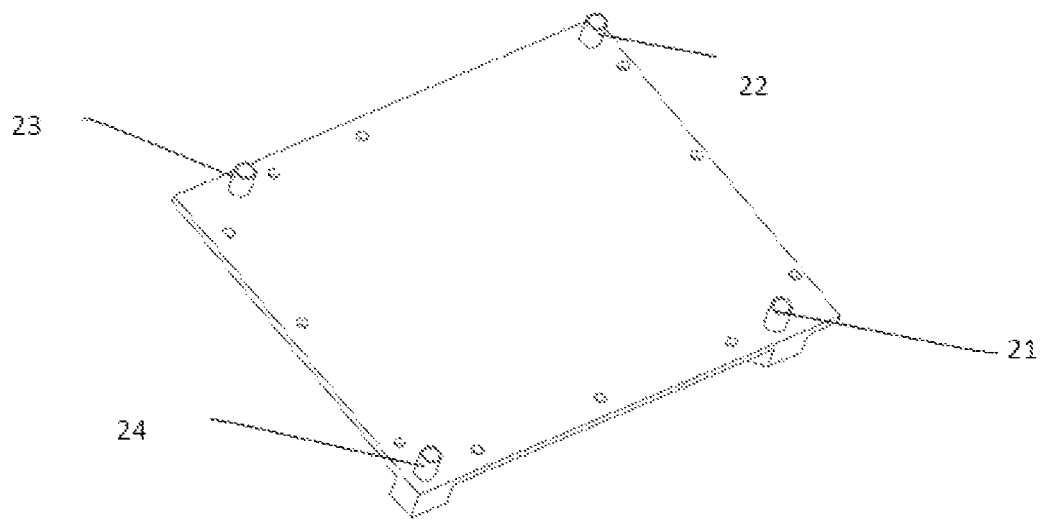
FIG. 6 is a structural view of an upper water channel substrate.
Figure 7:
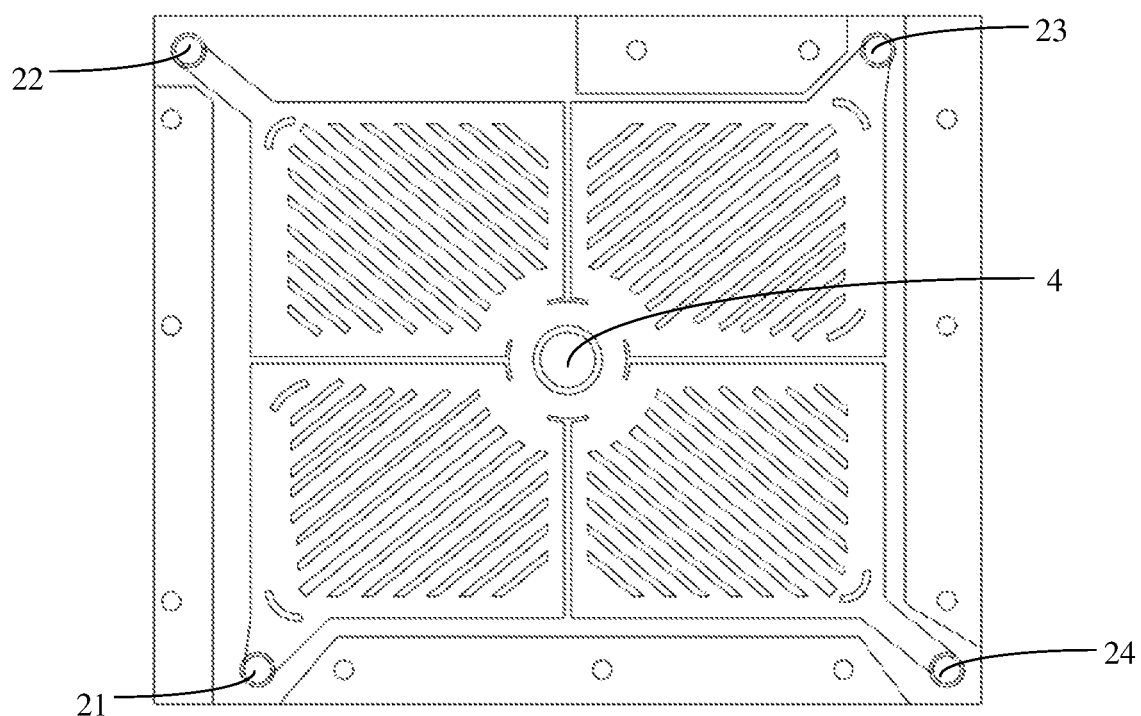
FIG. 7 is a view showing distribution of internal water channels of the upper water channel substrate.

As shown in FIGS. 6 and 7, a top of the upper water channel substrate 1 is provided with a water inlet 4, and four corners at a bottom of the upper water channel substrate 1 are provided with a first water outlet 21, a second water outlet 22, a third water outlet 23 and a fourth water outlet 24 correspondingly.

Figure 8:
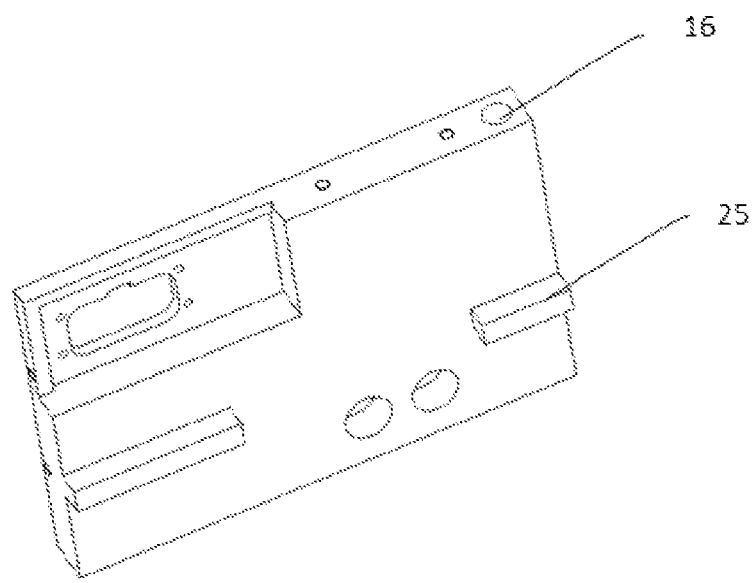
FIG. 8 is a structural view of a front water channel substrate.
Figure 9:
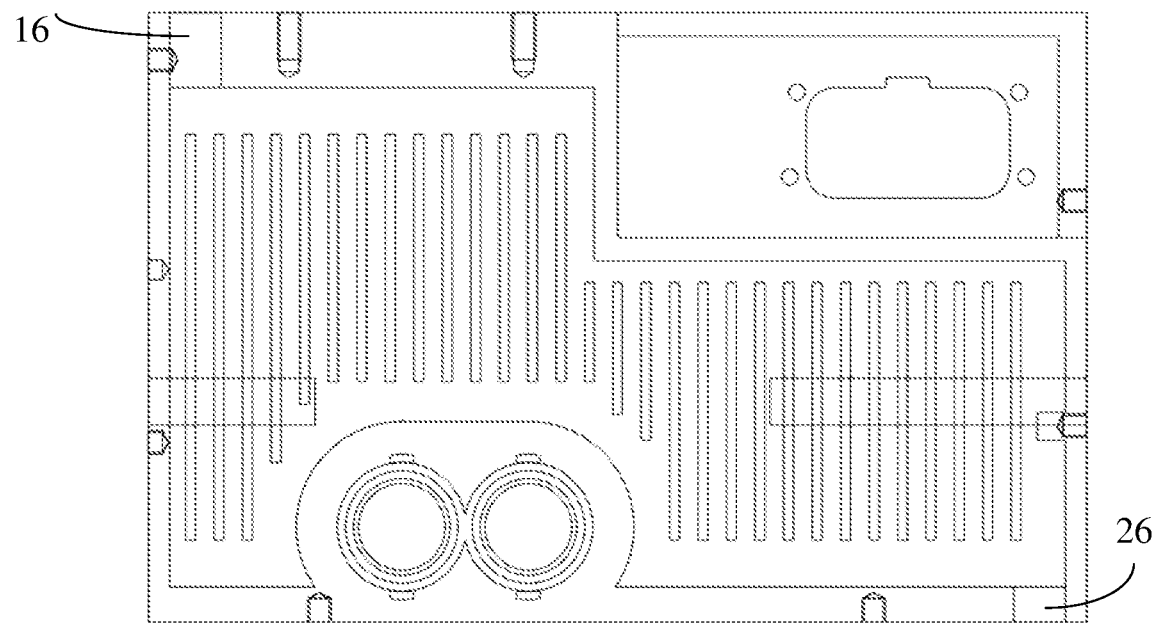
FIG. 9 is a view showing distribution of internal water channels of a front water channel substrate.

As shown in FIGS. 8 and 9, a top of the front water channel substrate 2 is provided with a second water inlet 16 communicating with the first water outlet 21, and a bottom of the front water channel substrate 2 is provided with a fifth water outlet 26. A middle part of an inner side of the front water channel substrate 2 is provided with a front supporting slide block 25.

Figure 10:
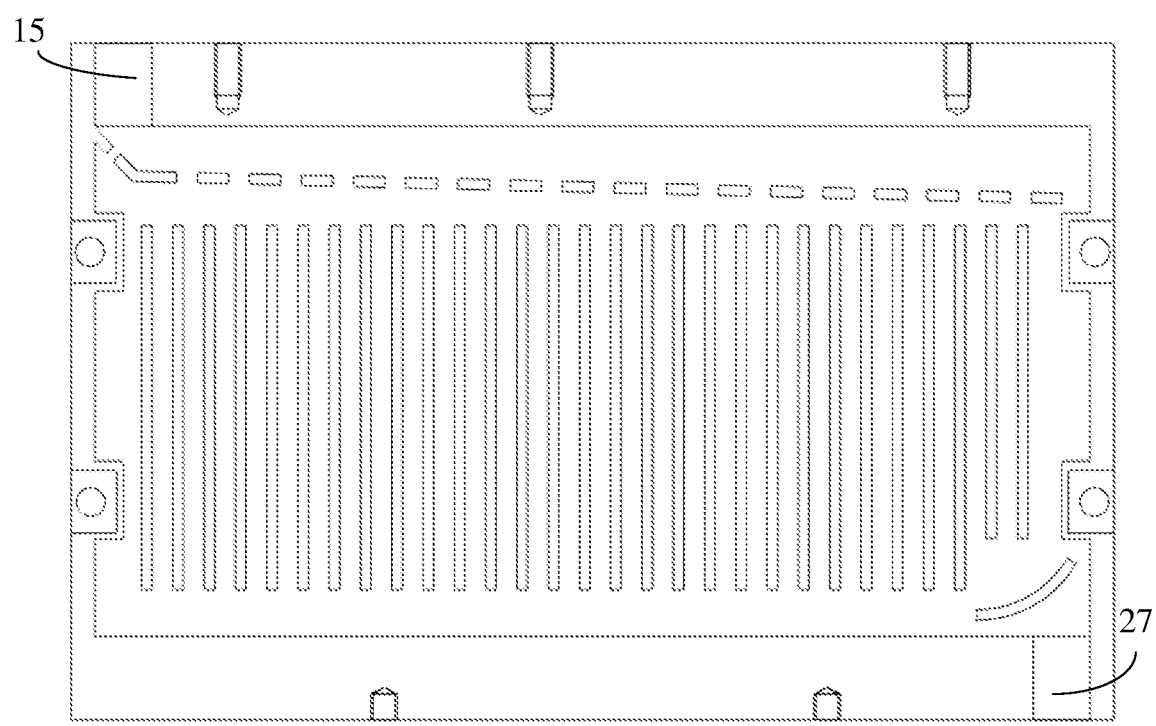
FIG. 10 is a view showing distribution of internal water channels of a left water channel substrate.

As shown in FIG. 10, a top of the left water channel substrate 3 is provided with a third water inlet 15 communicating with the second water outlet 22, and a bottom of the left water channel substrate 3 is provided with a sixth water outlet 27.

Figure 11:
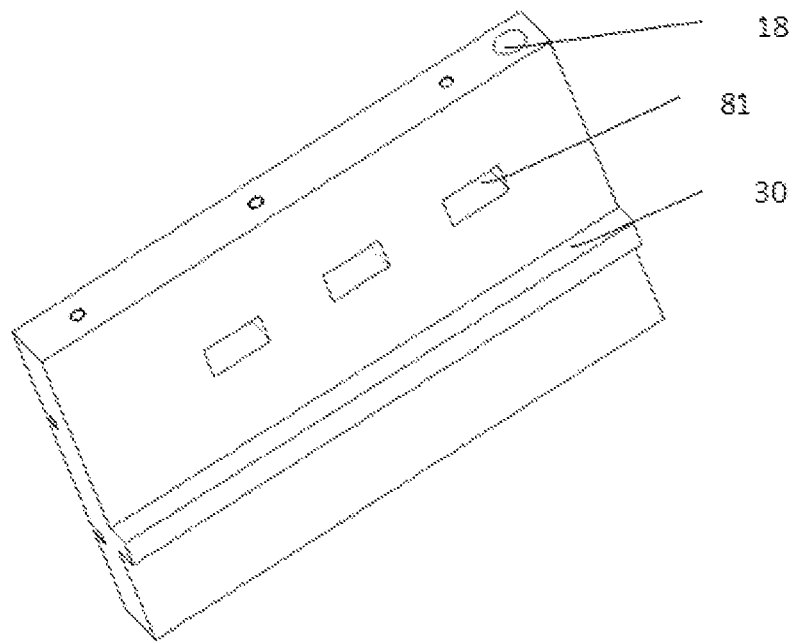
FIG. 11 is a structural view of a rear water channel substrate.
Figure 12:
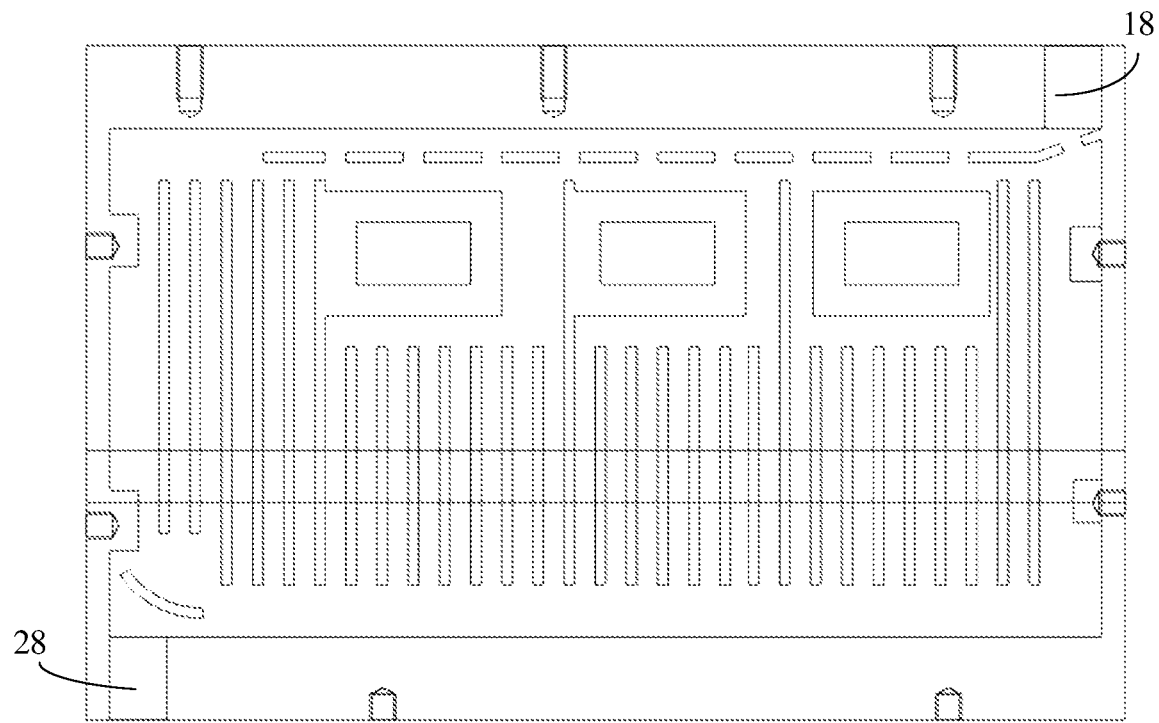
FIG. 12 is a view showing distribution of internal water channels of the rear water channel substrate.

As shown in FIGS. 11 and 12, a top of the rear water channel substrate 8 is provided with a fourth water inlet 18 communicating with the third water outlet 23, and a bottom of the rear water channel substrate 8 is provided with a seventh water outlet 28. A middle part of an inner side of the rear water channel substrate 8 is provided with a rear supporting slide block 30.

Figure 13:
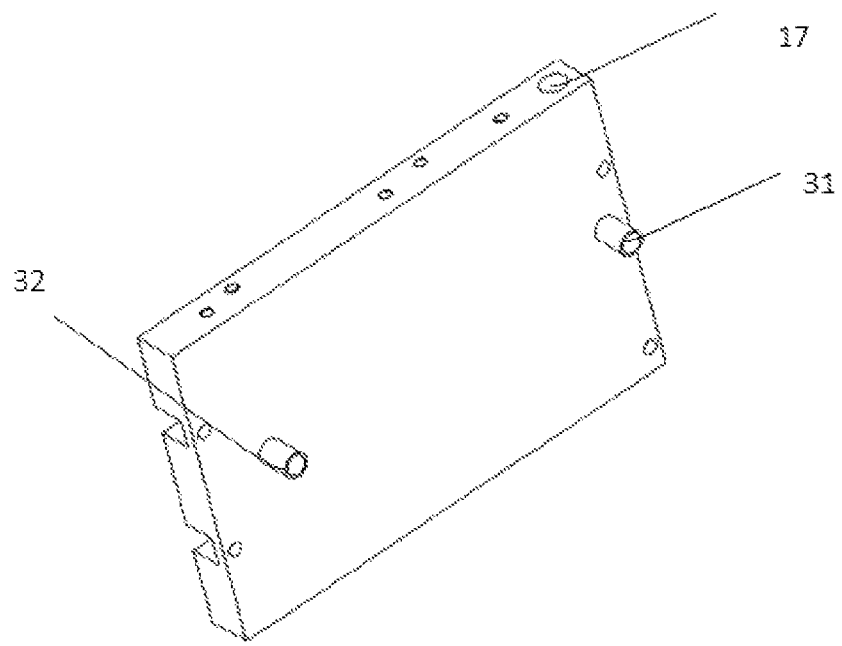
FIG. 13 is a structural view of a right water channel substrate.
Figure 14:
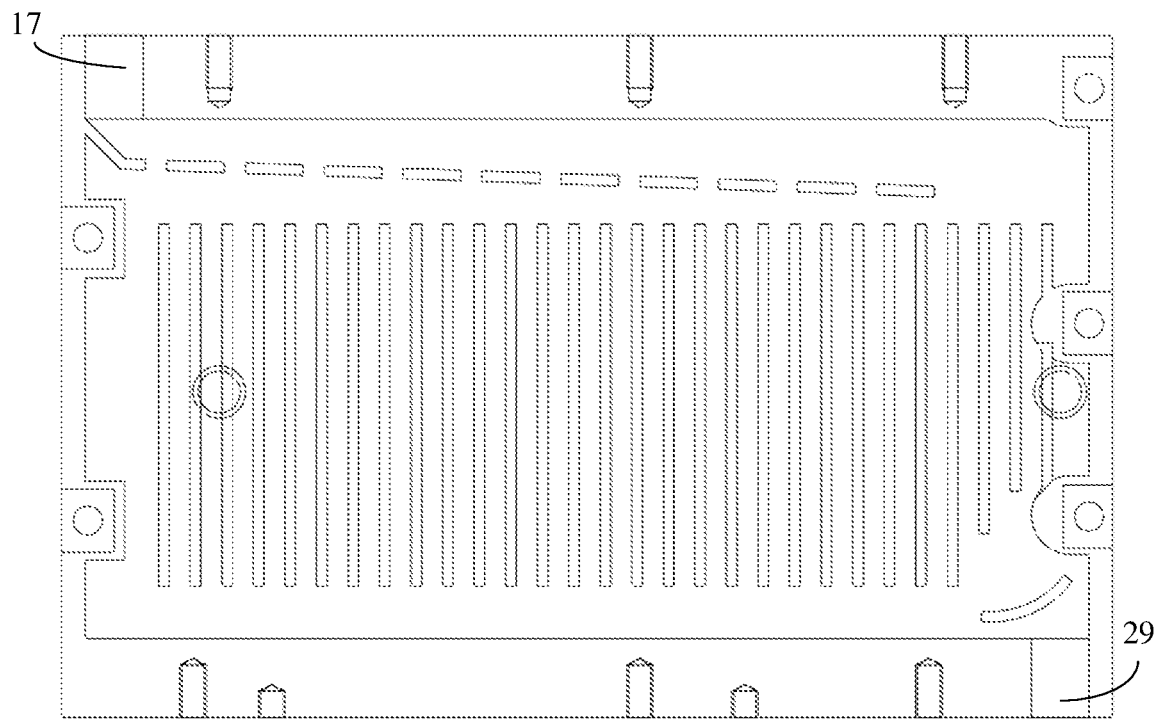
FIG. 14 is a view showing distribution of internal water channels of a right water channel substrate.

As shown in FIGS. 13 and 14, a top of the right water channel substrate 39 is provided with a fifth water inlet 17 communicating with the fourth water outlet 24, a bottom of the right water channel substrate 39 is provided with an eighth water outlet 29. A middle part of an inner side of the right water channel substrate 39 is provided with a tenth water outlet 31 and a tenth water inlet 32. In another embodiment, a middle part of an inner side of the left water channel substrate 3 is provided with the tenth water outlet 31 and the tenth water inlet 32.

Figure 15:
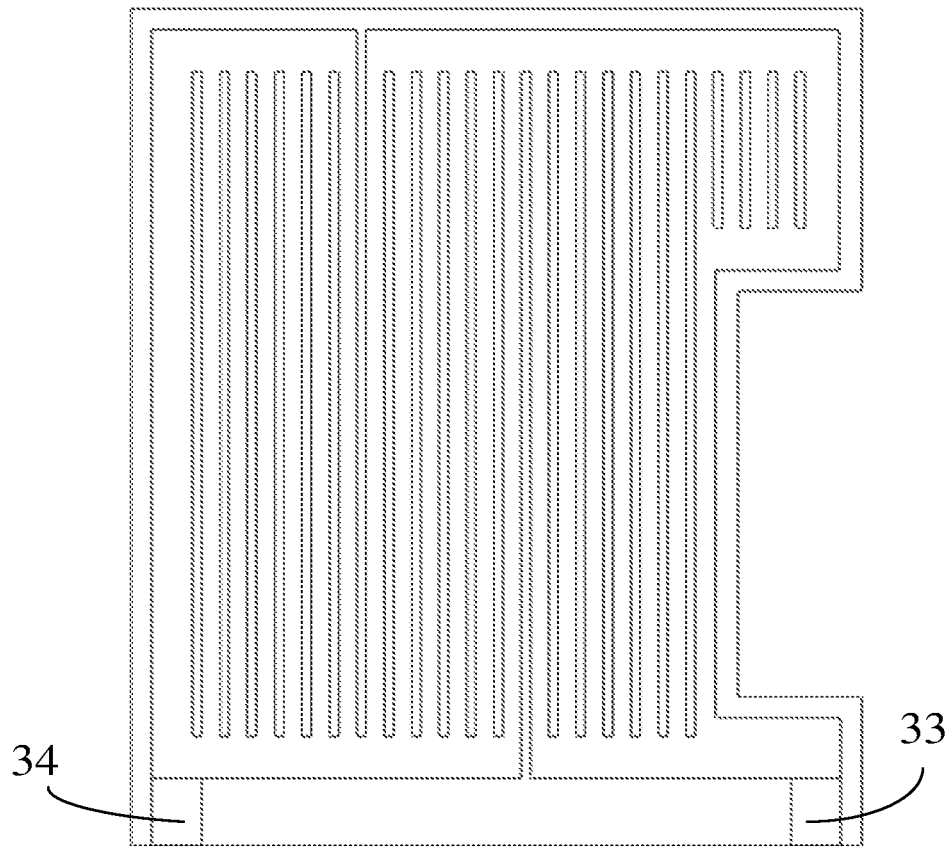
FIG. 15 is a view showing distribution of internal water channels of an intermediate water channel substrate.

As shown in FIG. 15, a front end and a rear end of the intermediate water channel substrate 20 are fixed on the box structure by the front support slide block 25 and the rear support slide block 30 correspondingly. A left end or a right end of the intermediate water channel substrate 20 is provided with an eleventh water inlet 33 communicating with the tenth water outlet 31 and an eleventh water outlet 34 communicating with the tenth water inlet 32, and a water channel is arranged inside the intermediate water channel substrate 20.

Figure 16:
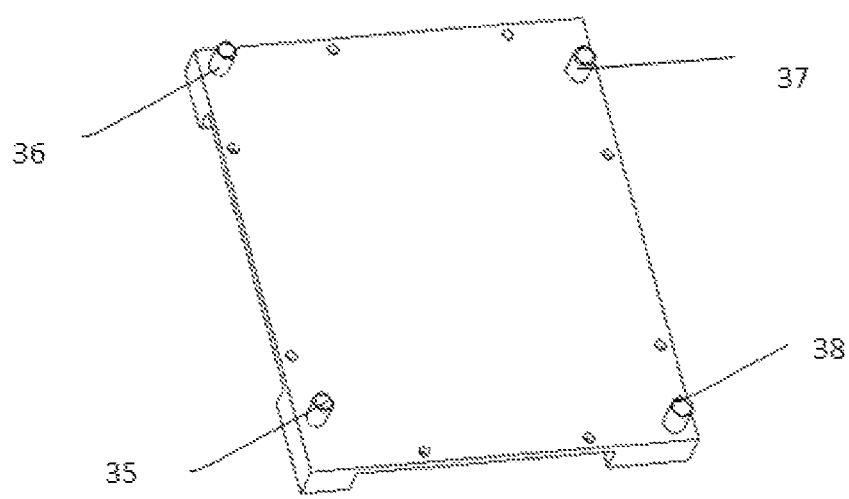
FIG. 16 is a structural view of a lower substrate.
Figure 17:
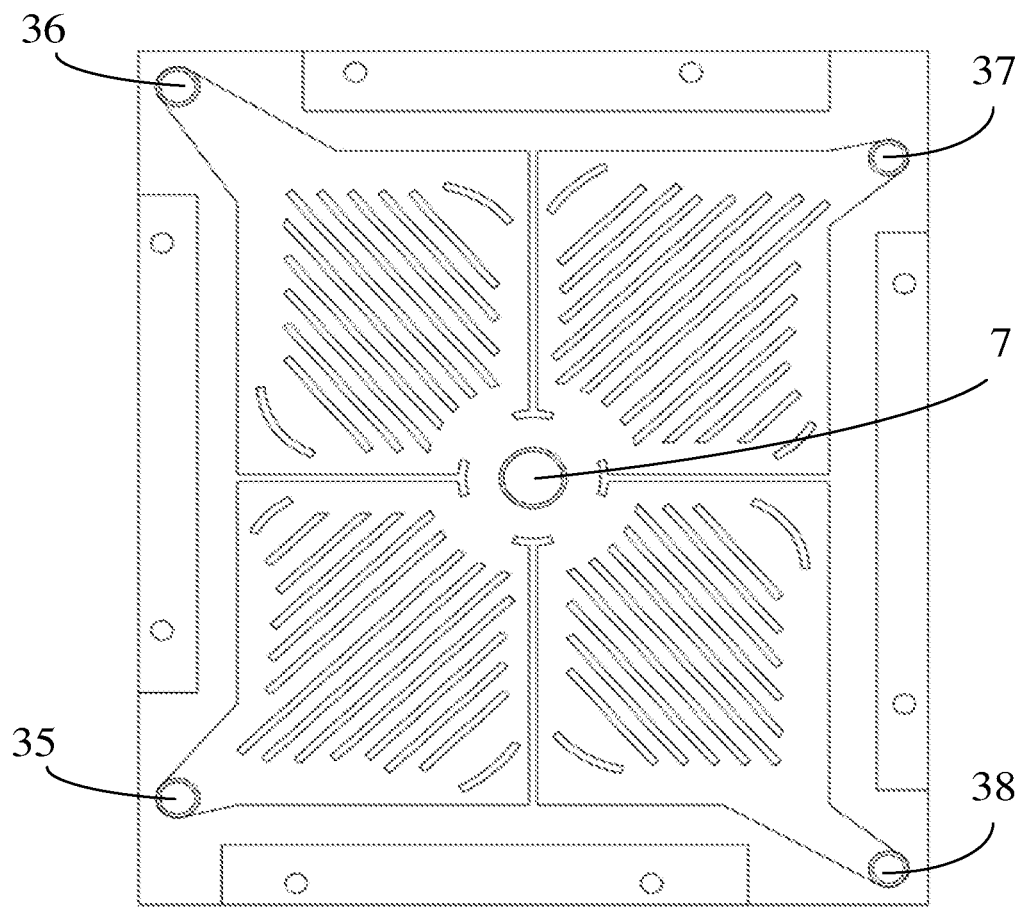
FIG. 17 is a view showing distribution of internal water channels of the lower substrate.

As shown in FIGS. 16 and 17, a top of the lower water channel substrate 40 is provided with a sixth water inlet 35 communicating with the fifth water outlet 26, a seventh water inlet 36 communicating with the sixth water outlet 27, an eighth water inlet 37 communicating with the seventh water outlet 28 and a ninth water inlet 38 communicating with the eighth water outlet 29. A bottom of the lower water channel substrate 40 is provided with a ninth water outlet 7.

According to the box type cooling structure of the controller, cooling liquid enters via the first water inlet 4 of the upper water channel substrate 1, and enters each water channel substrate via the first water outlet 21, the second water outlet 22, the third water outlet 23, the fourth water outlet 24, the second water inlet 16 of the front water channel substrate 2, the third water inlet 15 of the left water channel substrate 3, the fourth water inlet 18 of the rear water channel substrate 8 and the fifth water inlet 17 of the right water channel substrate 39 respectively. The intermediate water channel substrate 20 is provided in the middle of the controller, the cooling liquid in the right water channel 39 substrate can enter the intermediate water channel substrate 20 through the eleventh water inlet 33 of the intermediate water channel substrate 20, and then flows back into the right water channel substrate 39 from the eleventh water outlet 34, the cooling liquid in the front water channel substrate 2 flows out via the fifth water outlet 26, the cooling liquid in the left water channel substrate 3 flows out via the sixth water outlet 27, the cooling liquid in the rear water channel substrate 8 flows out via the seventh water outlet 28 and the cooling liquid in the right water channel substrate 39 flows out via the eighth water outlet 29, and finally all the cooling liquid flows into the lower water channel substrate 40 via the sixth water inlet 35, the seventh water inlet 36, the eighth water inlet 37 and the ninth water inlet 38 on the lower water channel substrate 40, and flows out via the nine water outlet 7, the IGBT module, the capacitor and the inductor are located in the controller, and the cooling liquid passes through water channels in the water substrates and cools the IGBT module, the capacitor and the inductor. The three-phase output copper bar 9 is extended out from the three-phase output port 81 on the rear water channel substrate 8, and the cooling liquid in the rear water channel substrate 8 cools the three-phase output copper bar 9.

The six water channel substrates are connected through fasteners 10, and the joints of the water channel substrates are sealed by sealant or seal rings. Insertion positions of each water inlet and each water outlet are sealed by seal rings.

Second Embodiment

Figure 18:
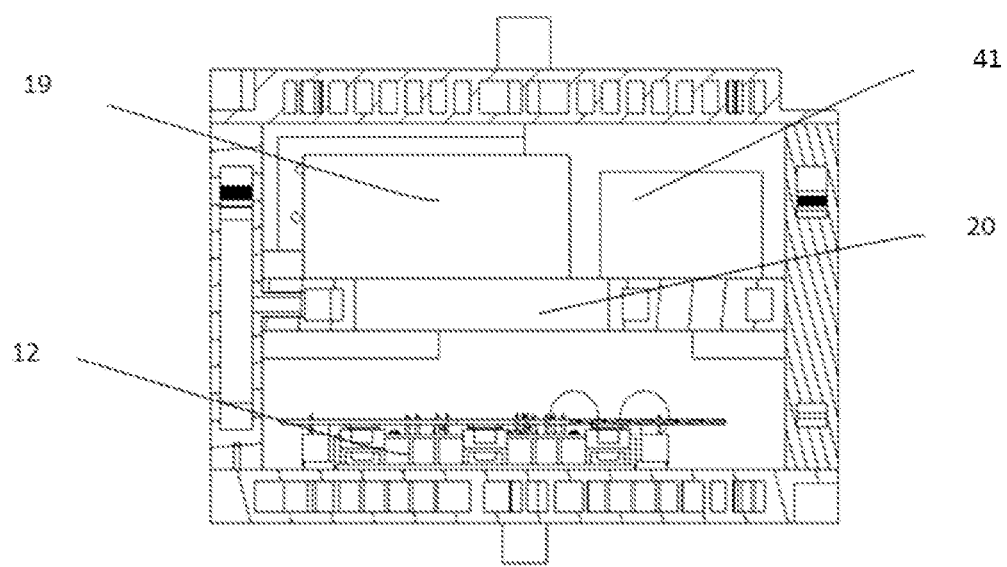
FIG. 18 is a cross-sectional view of the interior of the cooling structure of the controller of a second embodiment.

As shown in FIG. 18, in a second arrangement manner of the controller, a first cavity 41 is formed between the intermediate water channel substrate 20 and the upper water channel substrate 1, and the driving and controlling panel 11 and the film capacitor 19 are arranged inside the first cavity 41. The intermediate water channel substrate 20 and the lower water channel substrate 40 form a second cavity 42, and the IGBT module 12 is arranged inside the second cavity 42.

Third Embodiment

In a third arrangement manner of the controller, among the six water channel substrates, the film capacitor 19 is arranged on one water channel substrate, and a plurality of IGBT modules 12 are arranged on the other water channel substrates.

Figure 19:
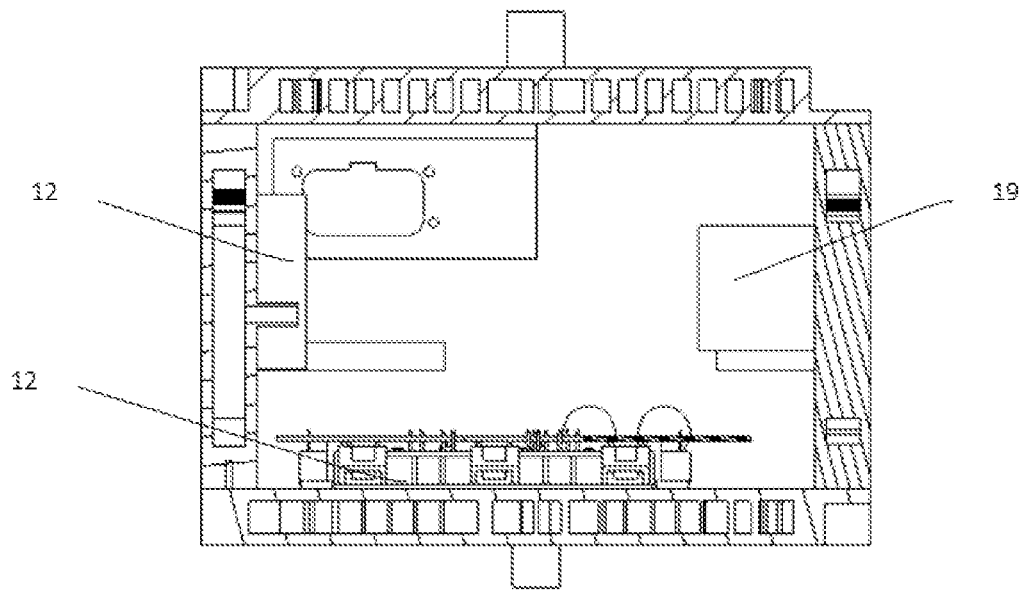
FIGS. 19 and 20 are cross-sectional views of the interior of the cooling structure of the controller of a third embodiment.

As shown in FIG. 19, the film capacitor 19 is arranged on the front water channel substrate 2, and the plurality of IGBT modules 12 are arranged on the lower water channel substrate.

Figure 20:
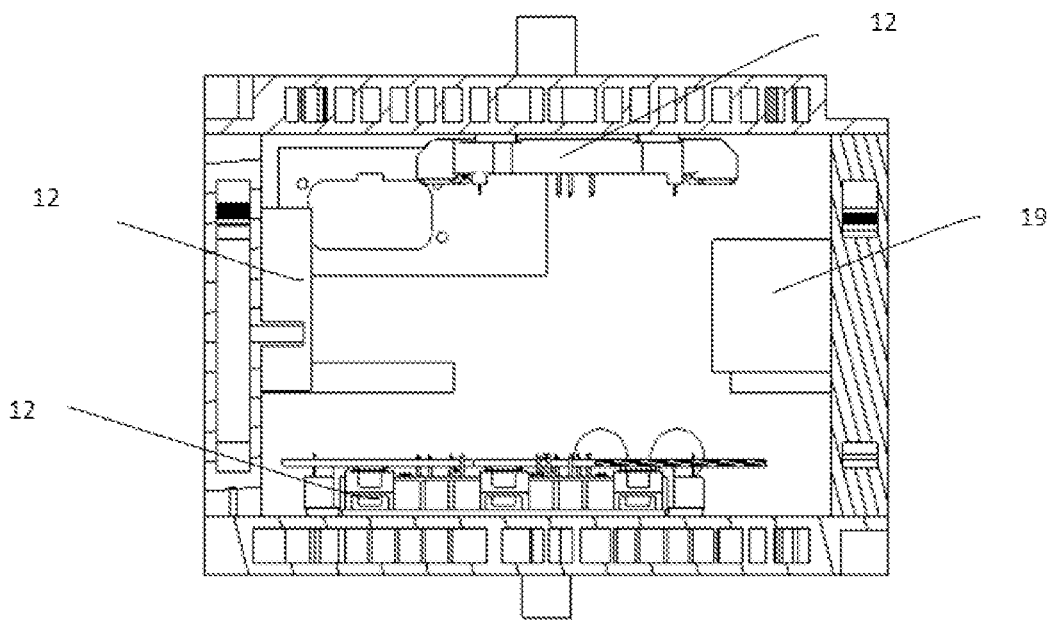

As shown in FIG. 20, the film capacitor 19 is arranged on the front water channel substrate 2, and the plurality of IGBT modules 12 are arranged on the upper water channel substrate 1, the rear water channel substrate 8 and the lower water channel substrate 40.

The above embodiments are only for illustrating the technical concept and features of the present application, and the purpose thereof is to enable a person skilled in the art to understand the contents of the present application and to implement the present application, and not to limit the scope of the present application. All modifications made according to the spirit of the main technical solution of the present application shall fall within the claimed scope of the present application.

What is claimed is:

1. A box type cooling structure of a controller, the controller comprising a driving and controlling board, an Insulated Gate Bipolar Translator (IGBT) module and a film capacitor, wherein the box type cooling structure comprises an upper water channel substrate, a front water channel substrate, a left water channel substrate, a rear water channel substrate, a right water channel substrate and a lower water channel substrate sequentially enclosed in six directions of the controller, wherein water channel structures are arranged in the upper water channel substrate, the front water channel substrate, the left water channel substrate, the rear water channel substrate, the right water channel substrate and the lower water channel substrate;

a water inlet is provided at a top of the upper water channel substrate, a first water outlet, a second water outlet, a third water outlet and a fourth water outlet are arranged in four corners of a bottom of the upper water channel substrate;

a second water inlet communicating with the first water outlet is provided at a top of the front water channel substrate, and a fifth water outlet is provided at a bottom of the front water channel substrate;

a third water inlet communicating with the second water outlet is provided at a top of the left water channel substrate, and a sixth water outlet is provided at a bottom of the left water channel substrate;

a fourth water inlet communicating with the third water outlet is provided at a top of the rear water channel substrate, and a seventh water outlet is provided at a bottom of the rear water channel substrate;

a fifth water inlet communicating with the fourth water outlet is provided at a top of the right water channel substrate, and an eighth water outlet is provided at a bottom of the right water channel substrate; and a sixth water inlet communicating with the fifth water outlet, a seventh water inlet communicating with the sixth water outlet, an eighth water inlet communicating with the seventh water outlet and a ninth water inlet communicating with the eighth water outlet are provided at a top of the lower water channel substrate, and a ninth water outlet is provided at a bottom of the lower water channel substrate.

2. The box type cooling structure of the controller according to claim 1, further comprising an intermediate water channel substrate; wherein a front supporting slide block is provided at a middle part of an inner side of the front water channel substrate and a rear supporting slide block is provided at a middle part of an inner side of the rear water channel substrate, a front end of the intermediate water channel substrate is fixed on the front supporting slide block, and a rear end of the intermediate water channel substrate is fixed on the rear supporting slide block;

a tenth water outlet and a tenth water inlet are provided in a middle part of an inner side of the left water channel substrate or the right water channel substrate; an eleventh water inlet communicating with the tenth water outlet and an eleventh water outlet communicating with the tenth water inlet are provided at a left end or a right end of the intermediate water channel substrate.

3. The box type cooling structure of the controller according to claim 2, wherein, a first cavity is formed between the intermediate water channel substrate and the upper water channel substrate, and the driving and controlling board and the IGBT module are arranged inside the first cavity; and a second cavity is formed between the intermediate water channel substrate and the lower water channel substrate, and the film capacitor is arranged inside the second cavity.

4. The box type cooling structure of the controller according to claim 3, wherein one side of the intermediate water channel substrate is provided with a notch, two connection terminals of the film capacitor are connected to the IGBT module via a first copper bar and a second copper bar passing through the notch respectively.

5. The box type cooling structure of the controller according to claim 4, wherein the rear water channel substrate is further provided with a three-phase output port, and a three-phase output copper bar of the IGBT module is extended out from the three-phase output port.

6. The box type cooling structure of the controller according to claim 2, wherein, a first cavity is formed between the intermediate water channel substrate and the upper water channel substrate, and the driving and controlling board and the film capacitor are arranged inside the first cavity; and a second cavity is formed between the intermediate water channel substrate and the lower water channel substrate, and the IGBT module is arranged inside the second cavity.

7. The box type cooling structure of the controller according to claim 1, wherein the film capacitor is arranged on one of the upper water channel substrate, the front water channel substrate, the left water channel substrate, the rear water channel substrate, the right water channel substrate and the lower water channel substrate, and a plurality of IGBT modules are arranged on the other of the upper water channel substrate, the front water channel substrate, the left water channel substrate, the rear water channel substrate, the right water channel substrate and the lower water channel substrate.

8. The box type cooling structure of the controller according to claim 1, wherein the upper water channel substrate, the front water channel substrate, the left water channel substrate, the rear water channel substrate, the right water channel substrate and the lower water channel substrate are connected by fasteners, and joints of the upper water channel substrate, the front water channel substrate, the left water channel substrate, the rear water channel substrate, the right water channel substrate and the lower water channel substrate are sealed by sealant or seal rings.

9. The box type cooling structure of the controller according to claim 1, wherein insertion positions of each water inlet and each water outlet are sealed by seal rings.

* * * * *